(12) United States Patent
Vittu

(10) Patent No.: US 7,504,666 B2
(45) Date of Patent: Mar. 17, 2009

(54) OPTICAL SEMICONDUCTOR PACKAGE WITH COMPRESSIBLE ADJUSTMENT MEANS

(75) Inventor: Julien Vittu, Voreppe (FR)

(73) Assignee: STMicroelectronics S.A., Montrouge (FR)

( * ) Notice: Subject to any disclaimer, the term of this patent is extended or adjusted under 35 U.S.C. 154(b) by 191 days.

(21) Appl. No.: 11/108,624

(22) Filed: Apr. 18, 2005

(65) Prior Publication Data

US 2005/0230772 A1   Oct. 20, 2005

(30) Foreign Application Priority Data

Apr. 20, 2004   (FR)  .................................. 04 04133

(51) Int. Cl.
*H01L 31/023* (2006.01)
(52) U.S. Cl. .................. 257/98; 257/431; 257/432; 257/433; 257/434; 257/435; 257/680; 257/E31.117; 257/E31.127
(58) Field of Classification Search ......... 257/431–435, 257/680, 98
See application file for complete search history.

(56) References Cited

U.S. PATENT DOCUMENTS 5,153,734 A   10/1992   Kanamori et al.
7,018,112 B2 *   3/2006   Franiatte ....................... 385/91
2002/0047119 A1   4/2002   Honda et al.
2005/0169618 A1 *   8/2005   Akada ......................... 396/55

FOREIGN PATENT DOCUMENTS

| DE | 199 58 229 | | 6/2000 |
|---|---|---|---|
| EP | 1 220 324 | | 7/2002 |
| EP | 1 271 214 | | 1/2003 |
| FR | 2849275 | * | 6/2004 |
| JP | 2004222064 | * | 8/2004 |

OTHER PUBLICATIONS

Preliminary French Search Report, FR 04 04133, dated Nov. 30, 2004.

* cited by examiner

*Primary Examiner*—A. Sefer
(74) *Attorney, Agent, or Firm*—Gardere Wynne Sewell LLP

(57) ABSTRACT

An optical semiconductor package includes a support with a passage to receive a ring holding a lens situated facing an optical sensor. The support has, in the passage, at least one local release recess and the ring is equipped peripherally with a locally projecting, elastically deformable element. The local release recess and the elastically deformable element are such that, when the ring occupies an angular mounting position, the locally projecting elastically deformable element is engaged in the local recess of the support and, when the ring is pivoted from the aforementioned angular mounting position, the locally projecting elastically deformable element is moved out of the recess of the support and is compressed against the wall of the passage in order to secure the ring relative to the support.

11 Claims, 5 Drawing Sheets

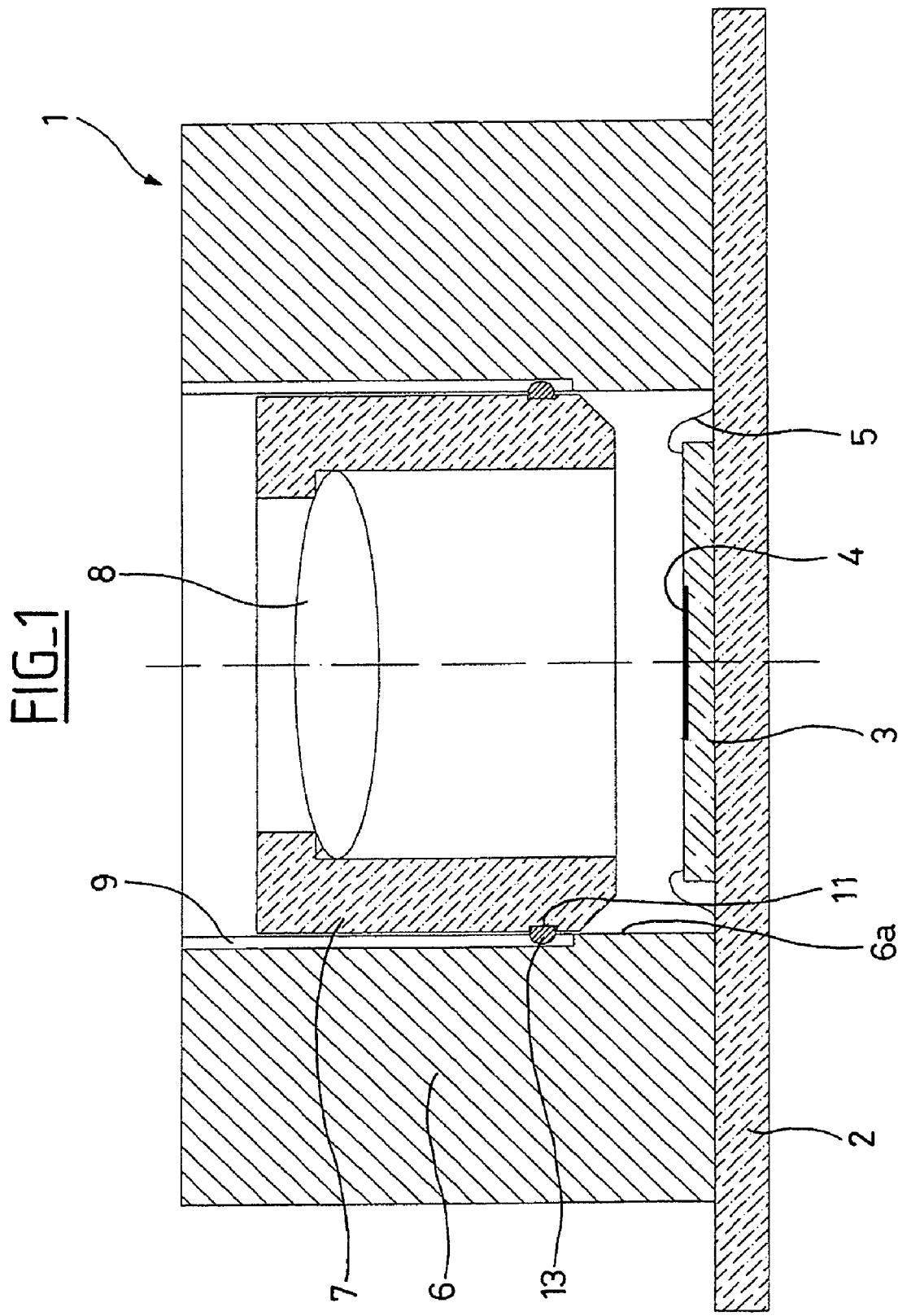
FIG_1

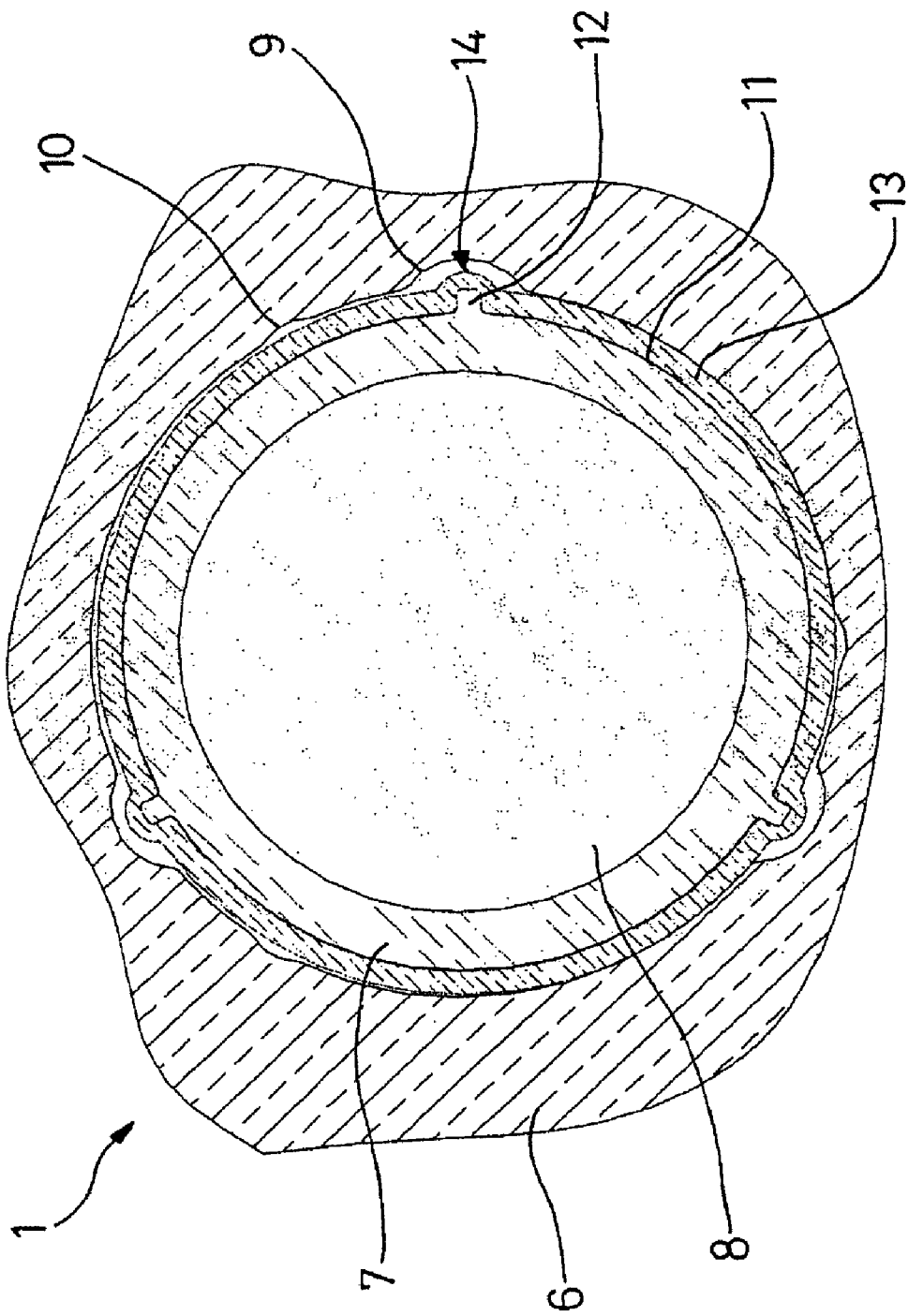
FIG_2

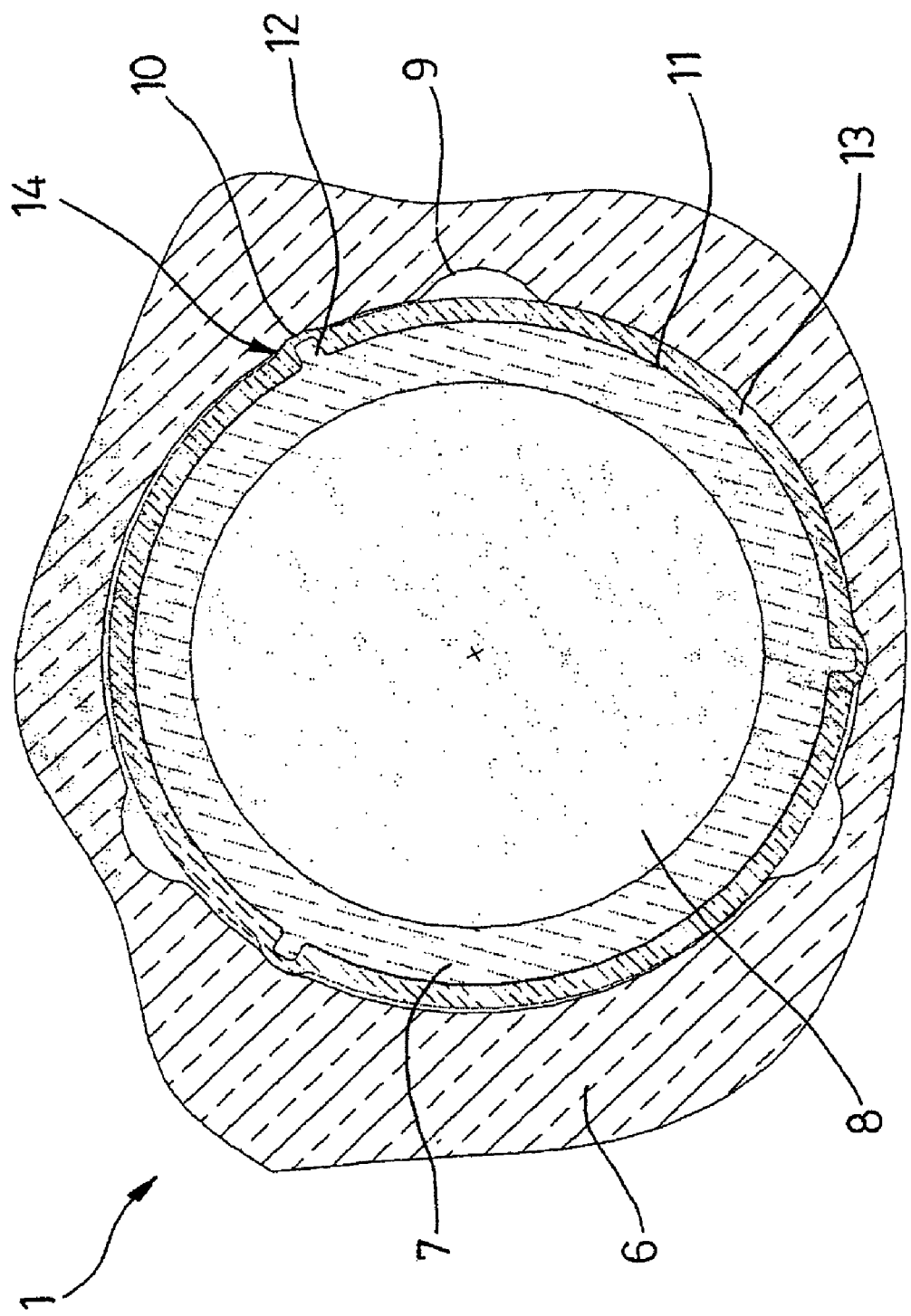
FIG_3

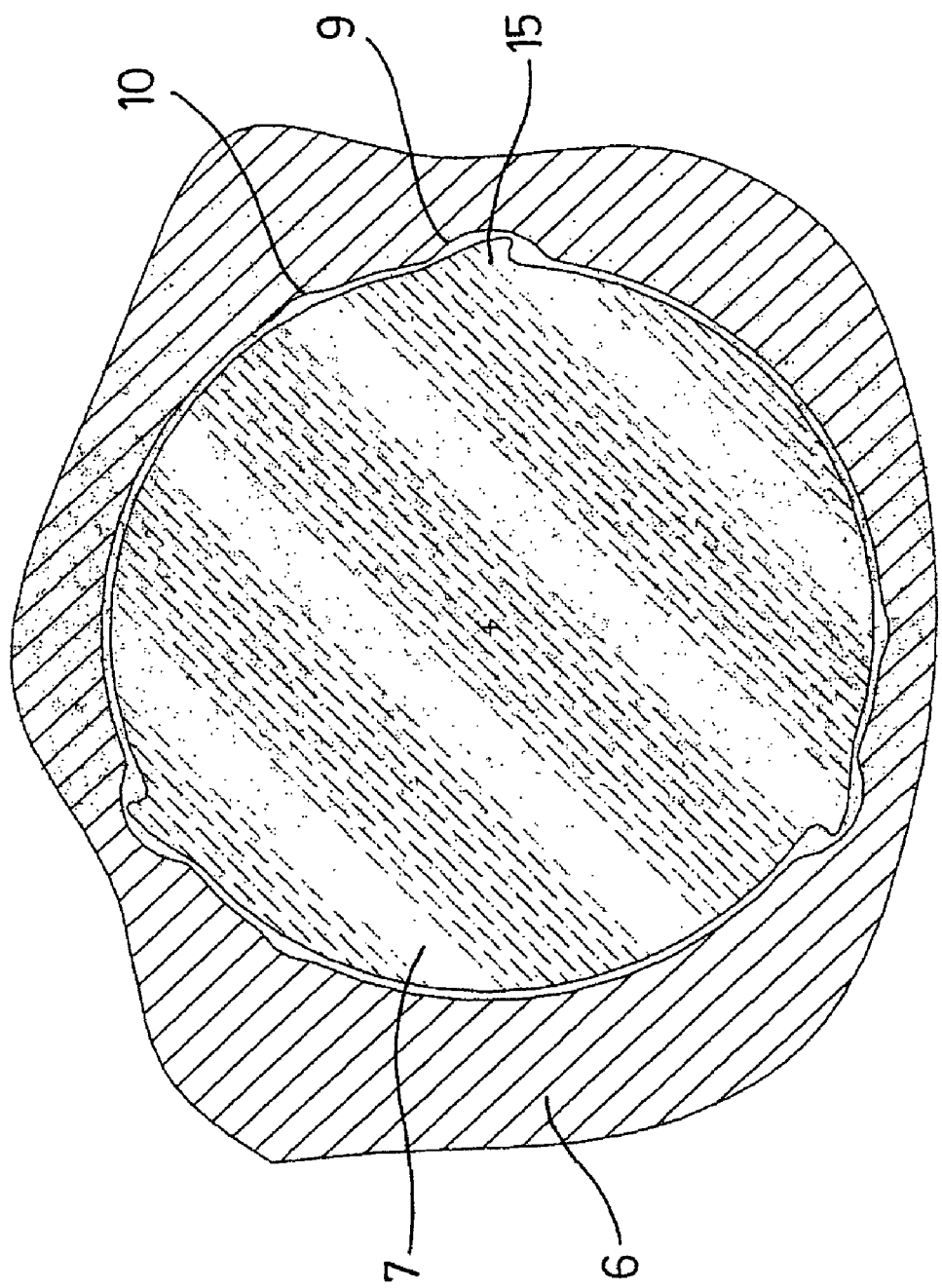
FIG_4

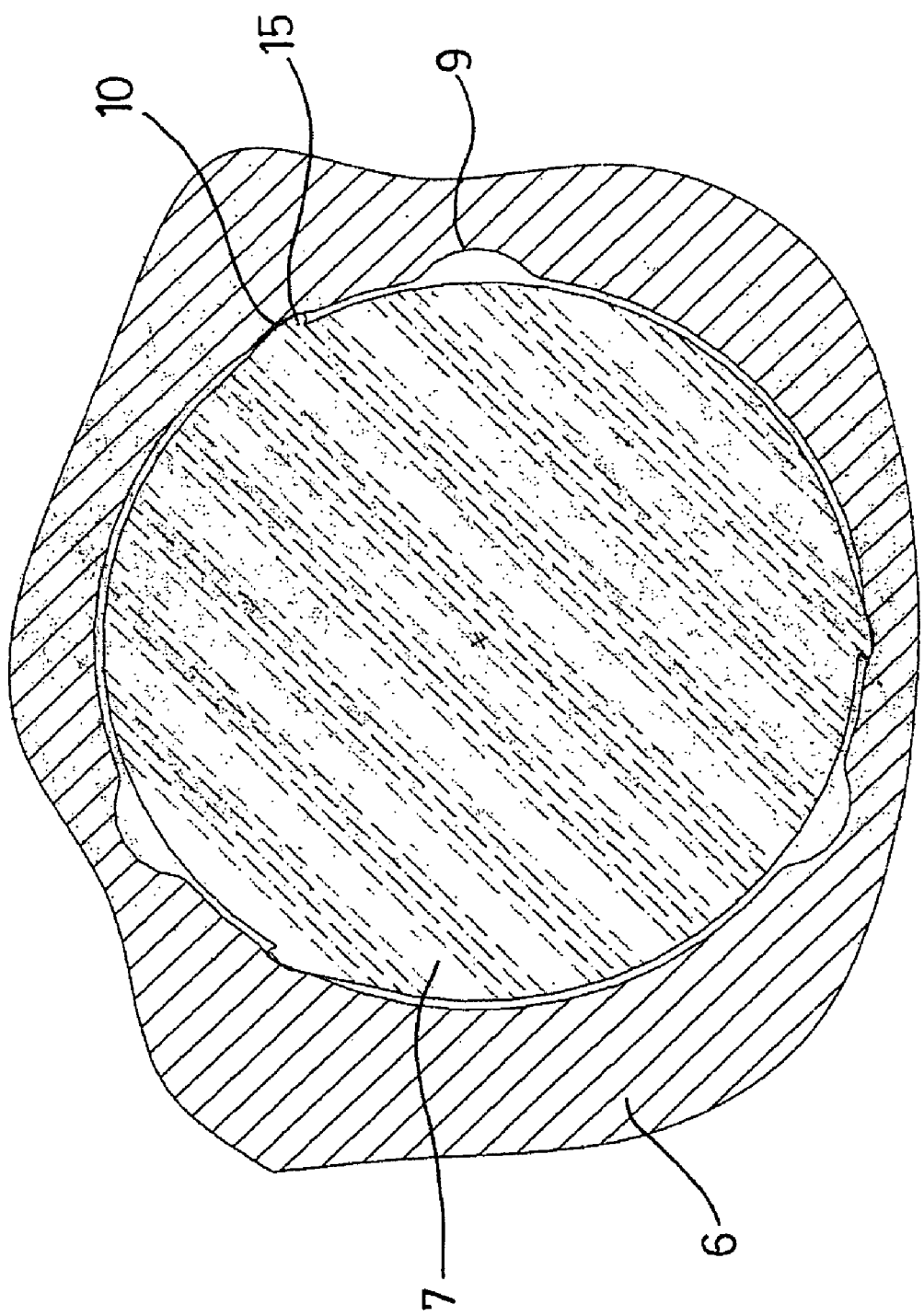
FIG_5

OPTICAL SEMICONDUCTOR PACKAGE WITH COMPRESSIBLE ADJUSTMENT MEANS

PRIORITY CLAIM

This application claims priority from French Application for Patent No. 04 04133 filed Apr. 20, 2004, the disclosure of which is hereby incorporated by reference.

BACKGROUND OF THE INVENTION

1. Technical Field of the Invention

The present invention relates to the field of optical semiconductor packages.

2. Description of Related Art

Optical semiconductor packages are known which include a plate, on the front of which are fixed an integrated circuit chip electrically linked to this plate and chip encapsulation means, supporting an objective lens situated facing the integrated optical sensor provided on the front of this chip.

Currently, these encapsulation means comprise a ring holding the lens and threaded externally, and a support with an internally threaded passage. The ring is coupled to the support by threaded coupling and the lens is adjusted relative to the optical sensor of the chip by the number of screw turns. When the required adjustment position is achieved, the ring must then be fixed on the support. This is done routinely by an additional bonding operation.

A need accordingly exists in the art to simplify the above coupling, adjustment and fixing operations.

SUMMARY OF THE INVENTION

An optical semiconductor package in accordance with an embodiment of the present invention comprises a support with a passage to receive a ring holding a lens situated facing an optical sensor. The support has, in said passage, at least one local release recess and the ring is equipped peripherally with a locally projecting, elastically deformable means. The local release recess and elastically deformable means are configured such that, when the ring occupies an angular mounting position, the locally projecting means is engaged in the local recess of the support and, when the ring is pivoted from the aforementioned angular mounting position, the locally projecting means is moved out of said recess of the support and is compressed against the wall of said passage in order to secure the ring relative to the support.

According to a variant of the invention, the ring has at least one peripheral groove and at least one stud projecting relative to the bottom of this groove, said elastically deformable means comprising an elastically deformable ring engaged in the peripheral groove and passing over said stud to be locally projecting.

According to a variant of the invention, said ring is in contact with the wall of said passage of said support.

According to another variant of the invention, the ring has at least one projecting land forming said elastically deformable means.

According to a variant of the invention, said local release recess is preferably formed by an axial groove opening out from at least one of its ends.

According to a variant of the invention, the wall of said passage preferably has at least one secondary local recess offset angularly relative to said local release recess, said locally projecting means being engaged in said secondary local recess when the ring is in a holding angular position.

According to a variant of the invention, said secondary local recess is preferably formed by an axial groove opening out from at least one of its ends.

According to a preferred variant of the invention, the wall of said passage of the support has at least three peripherally spaced local release recesses and said elastically deformable means has three locally projecting corresponding parts.

In accordance with an embodiment of the invention, an optical semiconductor package comprises a first support mounted to a semiconductor supporting base member, an inner surface of the first support having at least one axially extending first groove of a first depth and at least one axially extending second groove of a second depth wherein the first depth is greater than the second depth. A second support is sized and shaped to be received within the first support. At least one elastically deformable projection extends from an outer surface of the second support sized to freely fit within the first depth of the first groove and compressibly fit within the second depth of the second groove.

In accordance with an embodiment of the invention, an optical semiconductor package comprises a first support mounted to a semiconductor supporting base member, an inner cylindrical surface of the first support having at least one axially extending first groove of a first depth and a second support sized and shaped to be received within the first support. At least one elastically deformable projection extends from an outer cylindrical surface of the second support sized to freely fit within the first depth of the first groove and compressibly fit against the inner surface of the first support when the second support is rotated within the first support.

In accordance with another embodiment of the invention, an optical semiconductor package comprises a base member with an optical semiconductor chip mounted to the base member. A first support is mounted to the base member surrounding the optical semiconductor chip, an inner surface of the first support having at least one axially extending first groove. A second support is sized and shaped to be received within, and to be axially moved along, and to be rotatably moved with respect to, an interior of the first support. At least one elastically deformable projection extends from an outer surface of the second support sized to freely fit within the first depth of the first groove and compressibly fit against the inner surface of the first support following rotation of the second support to fix an axial position of the second support within the interior of the first support. A lens is fixedly mounted within an interior of the second support in axial alignment with the optical semiconductor chip, a distance between the lens and the optical semiconductor chip set by the axial position fixation of the second support within the interior of the first support.

BRIEF DESCRIPTION OF THE DRAWINGS

Advantages and features of the invention will become apparent upon examining the detailed description of the methods and embodiments of the invention, which are in no way limiting, and the appended drawings in which:

FIG. 1 represents a longitudinal cross section of an optical semiconductor package according to the present invention;

FIG. 2 represents a transverse cross section of the optical semiconductor package of FIG. 1, in a release position;

FIG. 3 represents a transverse cross section of the optical semiconductor package of FIG. 1, in an adjustment and holding position;

FIG. 4 represents a transverse cross section of a variant of the aforementioned optical semiconductor package, in an engaged position; and FIG. 5 represents a transverse cross section of the optical semiconductor package of FIG. 4, in an adjustment and holding position.

DETAILED DESCRIPTION OF THE DRAWINGS

Referring to FIGS. 1 to 3, it can be seen that the representation is of an optical semiconductor package 1 which comprises an electrical connection plate 2 on the front of which is bonded the back of an integrated circuit chip 3, the front of which has an optical sensor 4. Electrical connection terminals provided on the front of the chip 3 are linked to terminals on the front of the plate 2 by electrical lead wires 5.

On the front of the plate 2 is fixed an annular support 6 which surrounds the chip 3 and the wires 5 at a distance, this support 6 having a cylindrical passage 6a to receive a cylindrical ring 7 holding in its passage an optical objective lens 8, situated facing the optical sensor 4 of the chip 3.

The wall of the receiving cylindrical passage 6a has local release recesses formed by three axial release grooves 9 peripherally spaced at 120° intervals, as well as secondary local recesses formed by three secondary axial grooves 10 peripherally spaced at 120° intervals and offset angularly relative to the main axial grooves 9, for example by 30°, the axial release grooves 9 and the secondary axial grooves 10 opening out at the front end of the passage 6.

In section, the axial release grooves 9 and the secondary axial grooves 10 have concave rounded bottoms and convex rounded edges. The depth of the axial release grooves 9 is substantially greater than the depth of the secondary axial grooves 10.

The cylindrical ring 7 has a peripheral groove 11 at the bottom of which are provided three projecting studs 12 at 120° intervals that do not reach the edges of this groove 11.

In the peripheral groove 11 of the ring 7 there is an elastically deformable ring 13 which passes over the studs 12 to form, at three points, locally projecting parts 14 comprising a locally projecting elastically deformable means or elastically deformable local projection relative to the peripheral face of the ring 7.

The ring 7 can be coupled in the support 6 by the following method.

For example, using a specially designed tool, the ring 7 is placed axially facing the passage 6a of the support 6 by placing the locally projecting parts 14 of the elastically deformable ring 13 in line with the axial release grooves 9.

As FIG. 2 shows, the ring 7 is engaged axially in the passage 6a of the support 6 as far as an axial adjustment position of the lens 8 relative to the optical sensor 4 of the chip 3.

The peripheral groove 11 of the ring 7, its studs 12, the ring 13 and the axial release grooves 9 of the support 6 are dimensioned to ensure that this engaging movement is achieved preferably without friction.

When said axial adjustment position is reached, the ring 7 is pivoted or turned relative to the support 6. This done, the locally projecting parts 14 of the ring 13 are moved out of the axial release grooves 9 of the support 6 and are compressed against the wall of the passage 6a of this support. The internal diameter of the passage 6a of the support 6, the outer diameter of the ring 7 and the thickness of the locally projecting parts 14 of the ring 13 are adapted accordingly.

As FIG. 3 shows, when the locally projecting parts 14 of the ring 13 are lined up with the secondary grooves 10, the rotation of the ring 7 is stopped, these parts 14 expanding slightly into these secondary grooves 10.

Then, the ring 7 which is then held in its axial adjustment position by the elastic compression effect of the locally projecting parts 14 of the ring 13 is released.

The elastic ring 13 can also be in contact with the wall of the passage 6a of the support 6 to form a protective seal.

Referring to FIGS. 4 and 5, it can be seen that a variant of the package 1 is represented, in which the locking means of the ring 7 is, this time, formed by three projecting lands 15 extending longitudinally over at least a part of the length of the outer wall of the ring 7 and at 120° intervals. In the example shown, the lands 15 are integral to the ring 7. As a variant, they could be added on.

The lands 15 have a section which reduces from their root to their tip and they are angled. The material chosen to produce the ring 7 is such that the lands 15 are elastically deformable and comprise a locally projecting elastically deformable means or elastically deformable local projection.

The coupling of the ring 7 equipped with the lands 15 with the support 6 can be achieved as described in the preceding example, the thickness of the elastically deformable lands 15 being adapted to the compression effect mentioned above. Furthermore, the lands 15 are preferably angled in the direction opposite to the direction of rotation of the ring 7 on coupling.

Thus, as FIG. 4 shows, the ring 7 is engaged axially in the passage 6a of the support 6 by engaging the projecting lands 15 axially in the axial release grooves 9 of this support 6, as far as an axial adjustment position of the lens 8 relative to the optical sensor 4 of the chip 3, the lands 13 and the axial release grooves 9 of the support 6 being dimensioned such that this engagement movement is preferably achieved without friction.

When said axial adjustment position is reached, the ring 7 is pivoted or turned relative to the support 6. This done, the lands 15 of the ring 7 are moved out of the axial release grooves 9 of the support 6 and are compressed against the wall of the passage 6a of this support. The internal diameter of the passage 6a of the support 6, the external diameter of the ring 7 and the form and the thickness of the projecting lands 15 of this ring 7 are adapted accordingly.

As FIG. 5 shows, when the lands 15 are lined up with the secondary grooves 10, the rotation of the ring 7 is stopped, these parts 14 expanding slightly into these secondary grooves 10.

Then, the ring 7 which is then held in its axial adjustment position by the elastic compression effect of the lands 15 of the ring 7 is released.

The present invention is not limited to the example described above. Many variants are possible without departing from the context defined by the appended claims.

What is claimed is:

1. An optical semiconductor package comprising:
an annular support with a central passage to receive a cylindrical ring having a central opening holding an edge of a lens situated facing an optical sensor, wherein said annular support has, in said central passage, at least one axially extending local release recess in an inside wall of the central passage and wherein the cylindrical ring is equipped peripherally with a locally projecting, elastically deformable means, said axially extending local release recess receiving said locally projecting, elastically deformable means when the cylindrical ring is oriented at a first angular mounting position to allow axial movement of the cylindrical ring inside the central passage and, when the cylindrical ring is pivoted inside the central passage of the annular support away from the first angular mounting position, the locally projecting, elastically deformable means is moved out of said axially extending local recess of the annular support and is compressed against the inside wall of said central passage in order to secure an axial position of the cylindrical ring and lens inside the central passage relative to the annular support.

2. The package according to claim 1, wherein the cylindrical ring has at least one peripheral groove extending around the cylindrical ring and at least one stud radially projecting relative to a bottom of this groove, said elastically deformable means comprising an elastically deformable ring seated within said peripheral groove and passing over said stud so as to be locally and radially projecting.

3. The package according to claim 2, wherein said cylindrical ring is in protective sealing contact with the inside wall of said central passage of said annular support.

4. The package according to claim 1, wherein the cylindrical ring has at least one projecting deformable land forming said locally projecting, elastically deformable means.

5. An optical semiconductor package, comprising:
a support with a passage to receive a ring holding a lens situated facing an optical sensor, wherein said support has, in said passage, a local release recess and wherein the ring is equipped peripherally with a locally projecting, elastically deformable means, said local release recess and said locally projecting, elastically deformable means being such that, when the ring occupies an angular mounting position, the locally projecting, elastically deformable means is engaged in the local release recess of the support and, when the ring is pivoted from the aforementioned angular mounting position, the locally projecting, elastically deformable means is moved out of said local release recess of the support and is compressed against a wall of said passage,
wherein the wall of said passage has at least one secondary local recess offset angularly relative to said local release recess, said locally projecting, elastically deformable means being engaged in said secondary local recess when the ring is in a holding angular position in order to secure the ring relative to the support.

6. The package according to claim 5, wherein each of said local release recess and said secondary local recess is formed by an axial groove.

7. An optical semiconductor package, comprising:
a support with a cylindrical central passage to receive a cylindrical ring having a central opening holding an edge of a lens situated facing an optical sensor, wherein said support has, in said cylindrical central passage, at least one local release recess and wherein the cylindrical ring is equipped peripherally with a locally projecting, elastically deformable means, said local release recess receiving said locally projecting, elastically deformable means when the cylindrical ring occupies a first angular mounting position to allow the cylindrical ring to be axially inserted into the cylindrical central passage, and, when the cylindrical ring is pivoted inside the cylindrical central passage from the first angular mounting position towards a second angular mounting position, the locally projecting, elastically deformable means is moved out of said local release recess and is compressed against an inside wall of said cylindrical central passage in order to secure an axial position of the cylindrical ring and lens relative to the support,
wherein the wall of said cylindrical central passage of the support has a plurality of spaced apart local release recesses and wherein said locally projecting, elastically deformable means has corresponding locally projecting, elastically deformable means.

8. An optical semiconductor package comprising:
a support with a cylindrical passage having an inner cylindrical wall;
a first recess extending parallel to an axis of the cylindrical passage along the inner cylindrical wall of the cylindrical passage;
a ring holding an edge of a lens, the ring being axially received and supported for pivotable rotation within the cylindrical passage, the ring having an outer cylindrical wall; and
an elastically deformable local projection associated with and extending radially out from the outer cylindrical wall of the ring, the elastically deformable local projection being fit within the first recess so as to allow axial movement of the ring within the cylindrical passage along a length of the first recess when the ring is oriented at a first angular position and further the elastically deformable local projection being compressed against the inner wall of the cylindrical passage in order to secure an axial position of the ring within the cylindrical passage relative to the support when the ring is pivoted within the cylindrical passage of the support about the cylindrical passage axis away from the first angular position toward a second angular position.

9. The optical semiconductor package as in claim 8 wherein the elastically deformable local projection is an elastically deformable projecting land.

10. The optical semiconductor package as in claim 8 wherein the elastically deformable local projection comprises:
an elastically deformable ring seated within a peripheral groove extending around the outer wall of the ring; and
a stud member locally projecting within the groove underneath the elastically deformable ring.

11. The optical semiconductor package as in claim 8 further including:
a second recess also extending parallel to the axis along the inner wall of the cylindrical passage at the second angular position, the elastically deformable local projection being compressed in the extending second recess of the cylindrical passage in order to secure the axial position of the ring within the cylindrical passage relative to the support when the ring is pivoted to the second angular position.

* * * * *